United States Patent
Dill, Jr. et al.

(10) Patent No.: US 6,554,878 B1
(45) Date of Patent: Apr. 29, 2003

(54) SLURRY FOR MULTI-MATERIAL CHEMICAL MECHANICAL POLISHING

(75) Inventors: Frederick Hayes Dill, Jr., Salem, NY (US); Eric James Lee, San Jose, CA (US); Peter Beverley Powell Phipps, Saratoga, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/332,490

(22) Filed: Jun. 14, 1999

(51) Int. Cl.$^7$ ............... C09G 1/02; C09G 1/04
(52) U.S. Cl. ............... 51/308; 51/307; 51/309; 106/3
(58) Field of Search .......... 451/41, 8; 252/186.1, 252/183.3, 183.4, 182.1, 182.32, 79.1; 51/308, 309, 307; 106/3; 438/692, 693

(56) References Cited

U.S. PATENT DOCUMENTS

| | | | |
|---|---|---|---|
| 4,954,142 A | 9/1990 | Carr et al. | 51/309 |
| 5,084,071 A | 1/1992 | Nenadic et al. | 51/309 |
| 5,441,442 A | 8/1995 | Haisma et al. | 451/63 |
| 5,483,735 A | 1/1996 | Postma et al. | 29/603 |
| 5,531,016 A | 7/1996 | Postma et al. | 29/603.16 |
| 5,575,837 A | * 11/1996 | Kodama et al. | 106/3 |
| 5,916,855 A | * 6/1999 | Avanzino | 51/307 |

FOREIGN PATENT DOCUMENTS

| | | | |
|---|---|---|---|
| EP | 0 773 580 A1 | 5/1997 | ....... H01L/21/3105 |
| JP | 5081613 | 4/1993 | ............ G11B/5/31 |
| JP | 7272211 | 10/1995 | ............ G11B/5/31 |

OTHER PUBLICATIONS

"Alkaline Formulations for Chemical Mechanical Polishing of Copper Utilizing Azole Passivation" *IBM Technical Disclosure Bulletin*, p. 187, vol. 37, No. 10, Oct. 1994.
"Chemical–Mechanical Polishing of Copper with Ammonium Persulfate" *IBM Technical Disclosure Bulletin*, p. 655, vol. 37, No. 10, Oct. 1994.

* cited by examiner

*Primary Examiner*—Michael Marcheschi
(74) *Attorney, Agent, or Firm*—Altera Law Group, LLC

(57) ABSTRACT

In a first aspect a slurry is provided for chemically mechanically polishing alumina and nickel iron to a common plane and in a second aspect a slurry is provided for additionally chemically mechanically polishing copper to a common plane. The slurry includes a first concentration of colloidal silica, a second concentration of potassium and/or sodium persulfate and a third concentration of ammonium persulfate. In the first aspect the first and second concentrations are tailored to chemically mechanically polish the alumina and the nickel iron at the same rate to a common plane and in the second aspect the slurry includes a third concentration of ammonium persulfate at a proper ratio to the potassium or sodium persulfate to chemically mechanically polish the copper at the same rate as the other materials to the same plane.

30 Claims, 6 Drawing Sheets

(12% SILICA SLURRY)

(6% SILICA SLURRY)

(6% SILICA SLURRY)

(9% SILICA SLURRY)

SLURRY FOR MULTI-MATERIAL CHEMICAL MECHANICAL POLISHING

BACKGROUND OF THE INVENTION

1. Field of the Invention

The present invention relates to a slurry for multi-material chemical mechanical polishing (CMP) and, more particularly, to a slurry which, in one aspect, is capable of CMP alumina and nickel iron (NiFe) to a common plane and, in a second aspect, is capable of CMP alumina, nickel iron (NiFe) and copper (Cu) to a common plane.

2. Description of the Related Art

Chemical mechanical polishing (CMP) is a process wherein a slurry is dispersed on a CMP tool for chemically and mechanically polishing different levels of different materials on a workpiece to a common plane. The CMP tool has a turntable with a pad on it and a holder which is capable of pressing a workpiece against the rotating turntable while the slurry is dispersed on the turntable. The slurry contains an abrasive material as well as a reactive material. The abrasive material may reduce the level of one of the materials of the workpiece while the combination of the abrasive and the reactive material reduces the level of another material of the workpiece. The hoped for situation is that the slurry will enable the CMP to remove the two materials on the workpiece at substantially the same rate so that the levels of these materials can be reduced to a common plane.

Chemical mechanical polishing will be especially useful for planarizing rows and columns of partially completed magnetic head assemblies wherein each magnetic head assembly includes a read head portion and a write head portion. Planarization at various levels of the magnetic head assembly during fabrication promotes improved magnetics of the magnetic layers in the assembly and reduces the risk of electrical shorting between electrical leads and electrically conductive layers within the magnetic head assemblies. It also reduces surface topography by allowing subsequent photolithographic steps to attain significantly higher optical resolution.

One of the first layers formed in a magnetic head assembly is a ferromagnetic first shield layer for the read head. After constructing a nonmagnetic electrically conductive first read gap layer on the first shield layer a read sensor assembly is formed on the second read gap layer along with first and second electrically conductive leads which are connected to side edges of the sensor and extend rearwardly into the head for connection to first and second terminals outside the head. After forming a nonmagnetic electrically insulative second read gap layer on the read sensor and the first and second leads a ferromagnetic second shield layer is formed on the second read gap layer. In a merged magnetic head assembly the second shield layer also serves as a first pole piece layer for the write head. In a piggyback head, after forming a nonmagnetic electrically insulative layer on the second shield layer, a ferromagnetic first pole piece layer is formed on the insulation layer. After forming a write gap layer and a first insulation layer of an insulation stack a write coil layer is formed on the first insulation layer. The first insulation layer extends across the first pole piece layer and therebeyond to insulate the write coil layer from the first pole piece layer and the underlying first shield layer of the read head. After forming second and third insulation layers of the insulation stack on the write coil layer a second pole piece layer is formed on the write gap layer, on the insulation stack and is connected to the first pole piece layer at a backgap. The last layer is an overcoat layer on the second pole piece layer. Multiple magnetic head assemblies are typically constructed in rows and columns on a wafer substrate.

After forming the first pole piece layer it is highly desirable that the magnetic head assembly be planarized before the construction of the write coil layer. Typically, the first pole piece layer is minimized in its width in order to reduce the overall inductance of the head and thereby preserve a higher data rate during the write function. In doing so, the width of the coil layer is significantly wider than the width of the first pole piece layer. The first insulation layer of the insulation stack covers the first pole piece layer and drops over the first and second side edges of the pole piece layer and then extends laterally in both directions from the first pole piece layer. Unfortunately, where the first insulation layer makes a step at the first and second side edges of the first pole piece layer the thickness of the first insulation layer undergoes a reduction which may result in pinholes exposing portions of the first and second side edges of the first pole piece layer. Since the first pole piece layer is electrically conductive this presents a problem when the write coil layer is formed on the first pole piece layer and likewise makes first and second steps at the first and second side edges of the first pole piece layer. Further, the steps of the write coil layer at the first and second side edges of the first pole piece layer result in poorly defined vertical edges of the write coil layer. The write coil layer is frame plated which results in the photoresist frame assuming a poorly defined shape as it transcends the first and second steps caused by the first and second side edges of the first pole piece layer. Accordingly, it would be highly desirable to planarize the magnetic head assembly before constructing the first insulation layer and the write coil layer.

SUMMARY OF THE INVENTION

We have provided a slurry for polishing various levels of the magnetic head assembly to a common plane, especially the level of the first pole piece layer of a magnetic head assembly before construction of a write coil layer. After the construction of the first pole piece layer we have investigated a process wherein alumina ($Al_2O_3$) is sputter deposited over the entire wafer at a level above the top level of the first pole piece layer. The alumina has a high profile on top of the first pole piece layer and a lower profile beyond the first and second side edges of the first pole piece layer wherein the lower level is above the top surface of the first pole piece layer. The first pole piece layer is typically nickel iron ($Ni_{80}Fe_{20}$). In a first aspect of the invention we have provided a slurry which, when used with a chemical mechanical polishing tool, the rate of reduction of the levels of the alumina and the nickel iron are substantially the same so that they can be chemically mechanically polished to a common plane. In the first aspect of the invention a first concentration of colloidal silica and a second concentration of potassium persulfate ($K_2S_2O_8$) or sodium persulfate ($Na_2S_2O_8$) is employed with water in a slurry wherein the first and second concentrations are selected so that the alumina and the nickel iron are polished at the same rate. In both aspects of the invention the slurries enable the alumina and the one or two metallic materials to be polished to a common plane.

In a second aspect of the invention we have provided a slurry that not only polishes the alumina and the nickel iron to a common plane but also polishes copper (Cu) at substantially the same rate so that during the chemical mechanical polishing process the alumina, the nickel iron and the copper are all polished to a common plane. Before or after constructing the coil layer, first and second vias are made to the first and second leads of the read sensor and copper is formed therein to make first and second copper studs that extend toward first and second terminal sites for the read head. Accordingly, when the magnetic head assembly is polished to a common level before constructing the write coil layer it is required that the slurry have the capability of polishing the alumina, the nickel iron of the first pole piece layer and the copper of the copper studs at the same rate to a common plane. The slurry contains a third concentration of ammonium persulfate $((NH_4)_2S_2O_8)$ wherein the first, second and third concentrations are selected so that the alumina, the nickel iron and the copper are polished at the same rate.

A third aspect of the present invention is to provide a ratio of the third concentration to the second concentration that polishes the first and second metals at the same rate and, while maintaining this ratio, adjusting the first concentration of the silica in order to optimize the chemical mechanical polishing for increasing manufacturing yield. The invention also includes making first and second aspects of the slurry as well as employing the first and second aspects of the slurry for chemical mechanical polishing various thin film devices such as magnetic head assemblies. The materials polished are exemplary and may optionally include other materials.

An object of the present invention is to provide a slurry which can be employed for chemically mechanically polishing (CMP) alumina and a first metal, such as nickel iron, at the same rate to a common plane.

Another object is to provide a slurry for chemically mechanically polishing (CMP) alumina and first and second metals, such as nickel iron and copper, at the same rate to a common plane.

A further object is to provide a method of making a slurry which contains a first concentration of silica and second and third concentrations of reactive materials wherein a ratio of the third concentration to the second concentration polishes first and second metals of a workpiece at the same rate and this rate is maintained constant while the first concentration is adjusted to optimize the rate of chemically mechanically polishing.

Another object is to provide a method of chemically mechanically polishing an alumina overcoat layer, a nickel iron first pole piece layer and copper studs with a slurry that chemically mechanically polishes the alumina, the nickel iron and the copper at the same rate so that the first pole piece layer, the alumina overcoat layer and the copper studs are chemically mechanically polished to a common plane.

The nature, objects, and advantages of the invention will become more apparent to those skilled in the art after considering the following detailed description in connection with the accompanying drawings.

DESCRIPTION OF THE PREFERRED EMBODIMENTS

Figure 1:
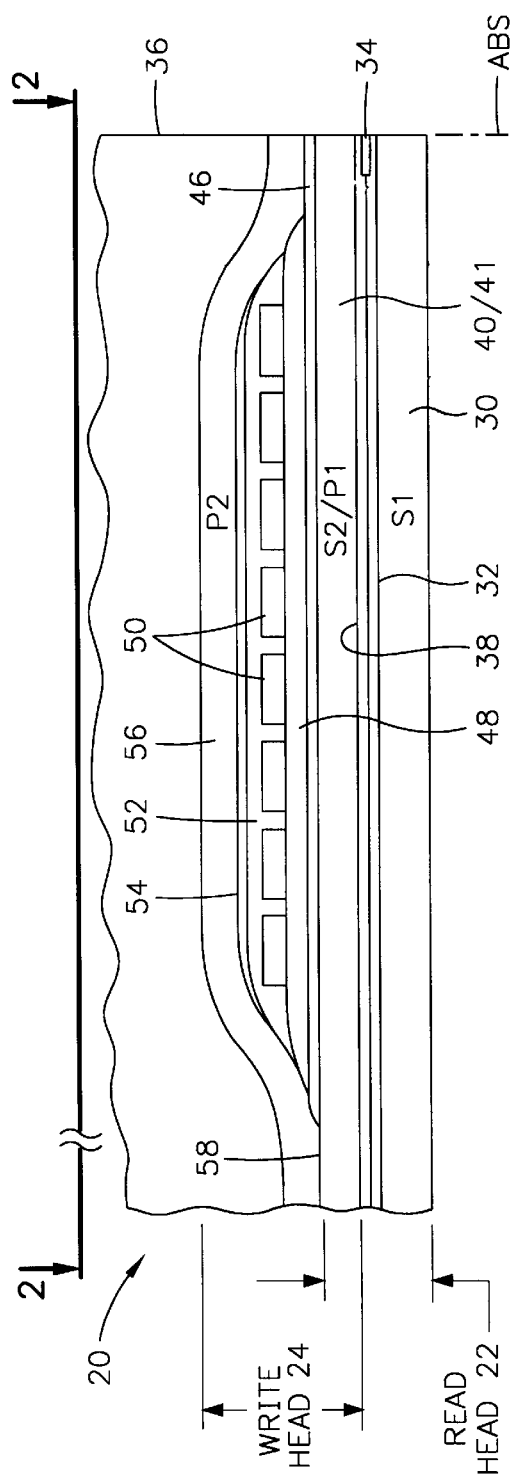
FIG. 1 is a vertical cross section of a front portion of an exemplary magnetic head assembly.
Figure 2:
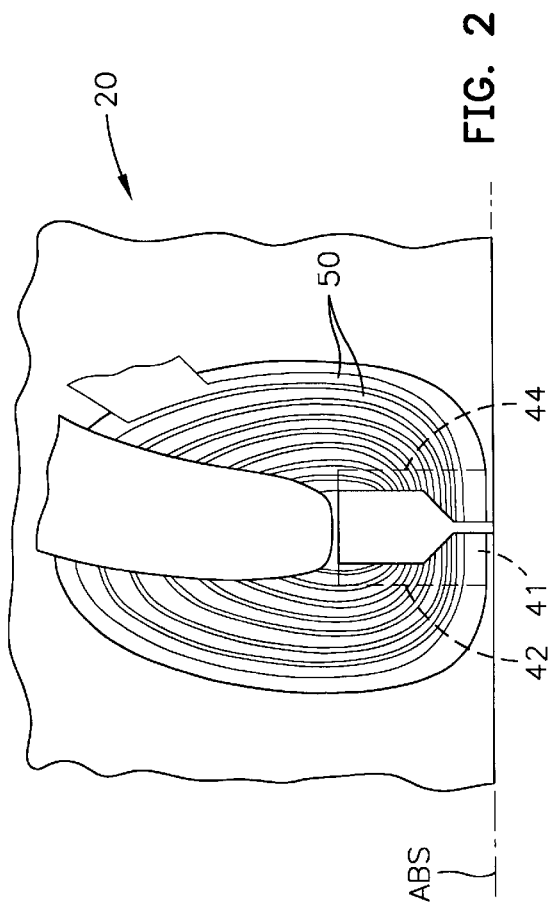
FIG. 2 is a view taken along plane 2—2 of FIG. 1.
Figure 3:
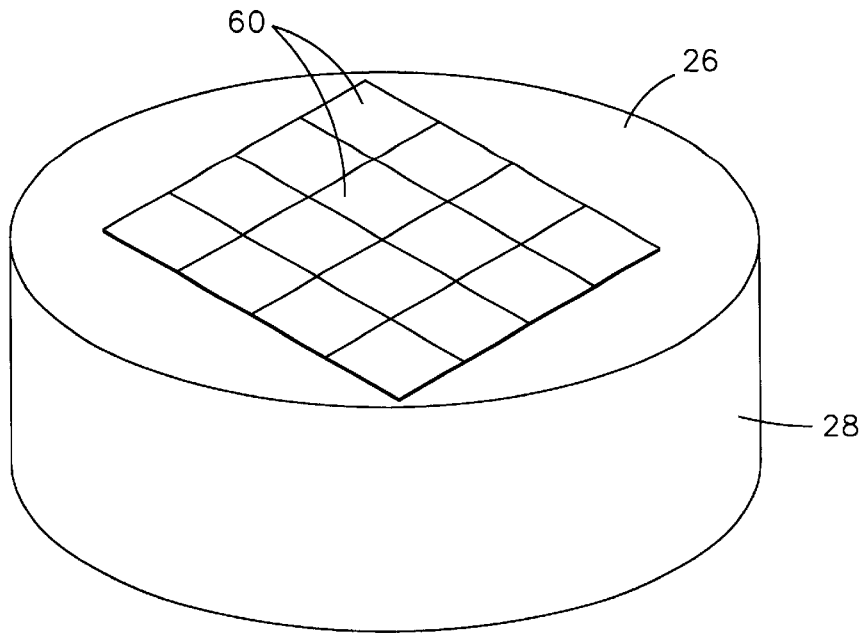
FIG. 3 is an isometric illustration of a wafer substrate upon which rows and columns of magnetic head assemblies are being constructed.

Referring now to the drawings wherein like reference numerals designate like or similar parts throughout the several views there is shown in FIGS. 1 and 2 an exemplary merged magnetic head assembly 20 which includes a read head portion 22 and a write head portion 24. The magnetic head assembly which may be made in rows and columns on a top surface 26 of a substrate 28, as shown in FIG. 3, is commenced by forming a ferromagnetic first shield layer (S1) 30 on the substrate. After forming a nonmagnetic electrically insulative first read gap layer (G1) 32 on the first shield layer a read sensor 34 is formed on the first gap layer along with first and second lead layers, to be discussed hereinafter, which are connected to first and second side edges of the sensor 34 and extend rearwardly in the magnetic head assembly away from an air bearing surface (ABS) 36. The air bearing surface of the magnetic head assembly is the surface that faces a rotating magnetic disk for writing signals in and reading signals from the rotating disk.

After constructing a nonmagnetic electrically insulative second read gap layer (G2) 38 on the read sensor 34 and the first and second lead layers a ferromagnetic second shield layer (S2) 40 is formed on the second read gap layer 38. In a merged magnetic head assembly the second shield layer 40 also serves as a first pole piece layer (P1) 41 for the write head 24. In a piggyback head (not shown) a nonmagnetic electrically insulative insulation layer is formed on the second shield layer 40 followed by formation of a first pole piece layer for the write head 24. The lateral expanse of the first pole piece layer 41 is defined by first and second side edges 42 and 44, as shown in FIG. 2. The width of the first pole piece layer 41 is minimized so as to reduce the inductance of the head during a write operation, thereby increasing the data rate of the head during the write operation.

After constructing the first pole piece layer 41 a write gap layer 46 is deposited on the first pole piece layer followed by formation of a first insulation layer 48 of an insulation stack.

The first insulation layer 48 and, optionally, the write gap layer 46 will drop down off of the first and second side edges 42 and 44 of the first pole piece layer forming first and second steps at these locations. Unfortunately, the first insulation layer 48 becomes thinner at these steps thereby posing a risk that the first insulation layer will have pinholes that expose portions of the first and second side edges 42 and 44 of the electrically conductive first pole piece layer. These exposed portions will result in shorts to the electrically conductive write coil layer 50 which is to be constructed on the first insulation layer 48. Further, the write coil layer 50 will be poorly formed as it dips down at the steps at 42 and 44 which degrades the performance of the write coil. This is because the write coil is frame plated and the photoresist is patterned with an irregular shape as it drops down over the first and second steps at 42 and 44. After forming the write coil layer 50, second and third insulation layers 52 and 54 of the insulation stack are formed followed by formation of a ferromagnetic second pole piece layer 56 which is formed on the gap 46 and the third insulation layer 54 and is connected to the first pole piece layer at a backgap 58. There is a strong-felt need for planarizing the magnetic head assembly at the top level of the first pole piece layer 41 so that the first insulation layer 48 is planarized below the lateral expanse of the write coil layer 50.

Figure 4:
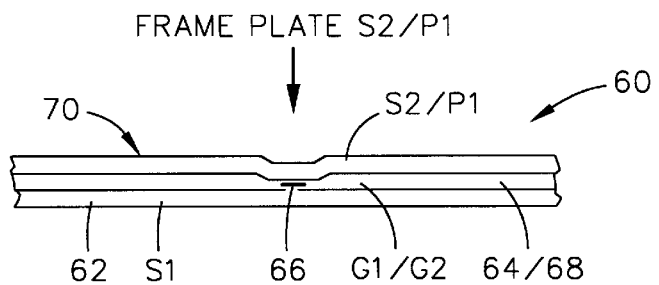
FIG. 4 is a cross sectional air bearing surface (ABS) illustration of various layers with a partially completed magnetic head assembly after the forming of a second shield first pole piece layer (S2/P1)
Figure 5:
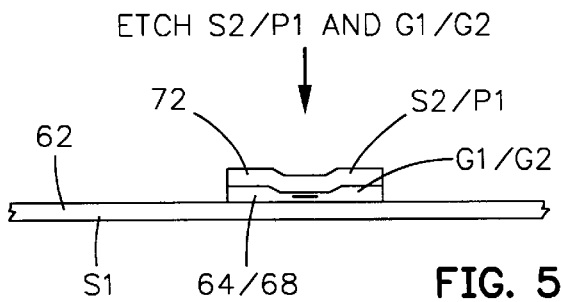
FIG. 5 is the same as FIG. 4 except the second shield and first pole piece layer (S2/P1) and first and second gap layers in a field beyond the second shield first pole piece layer (S2/P1) has been removed by etching.
Figure 6A:
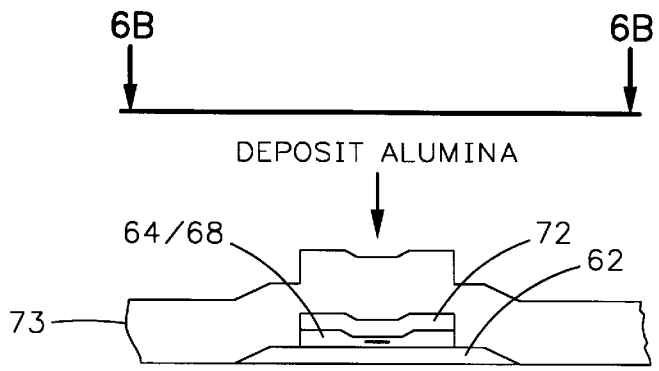
FIG. 6A is the same as FIG. 5 except alumina has been deposited over the entire wafer.
Figure 7A:
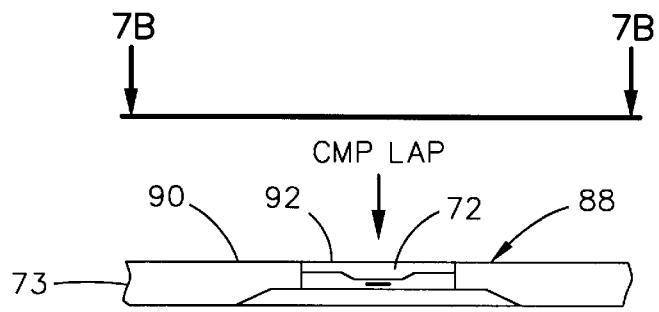
FIG. 7A is the same as FIG. 6A except the wafer has been chemically mechanically polished (CMP) to provide the second shield first pole piece layer (S2/P1), copper studs and the alumina with a common plane.
Figure 7B:
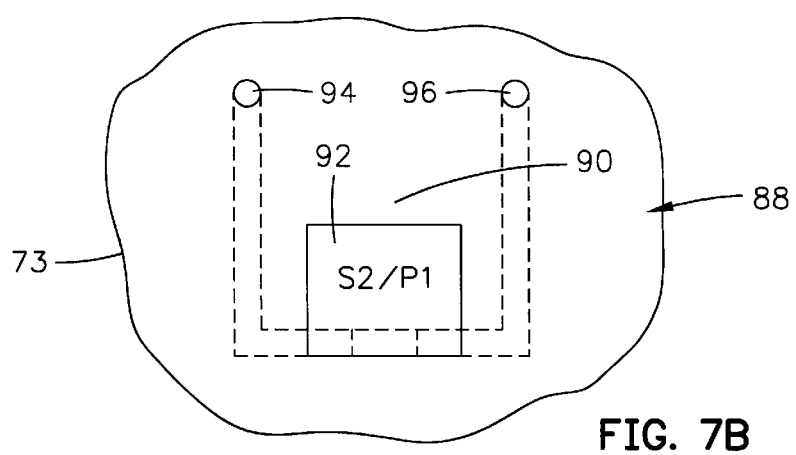
FIG. 7B is a view taken along plane 7B—7B of FIG. 7A.
Figure 8:
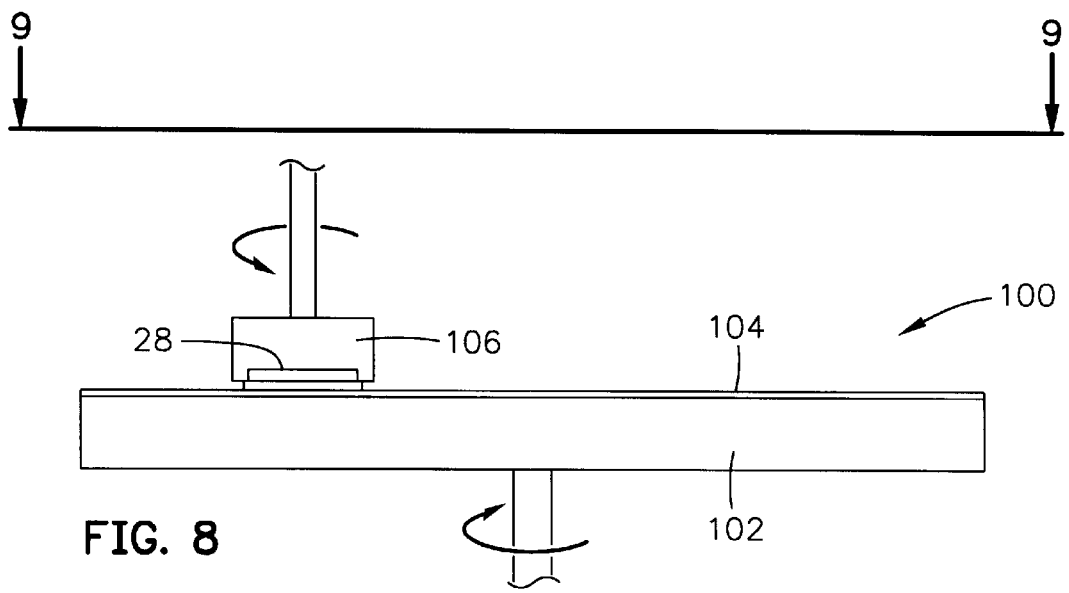
FIG. 8 is an elevation view of a typical chemical mechanical polishing (CMP) tool.
Figure 9:
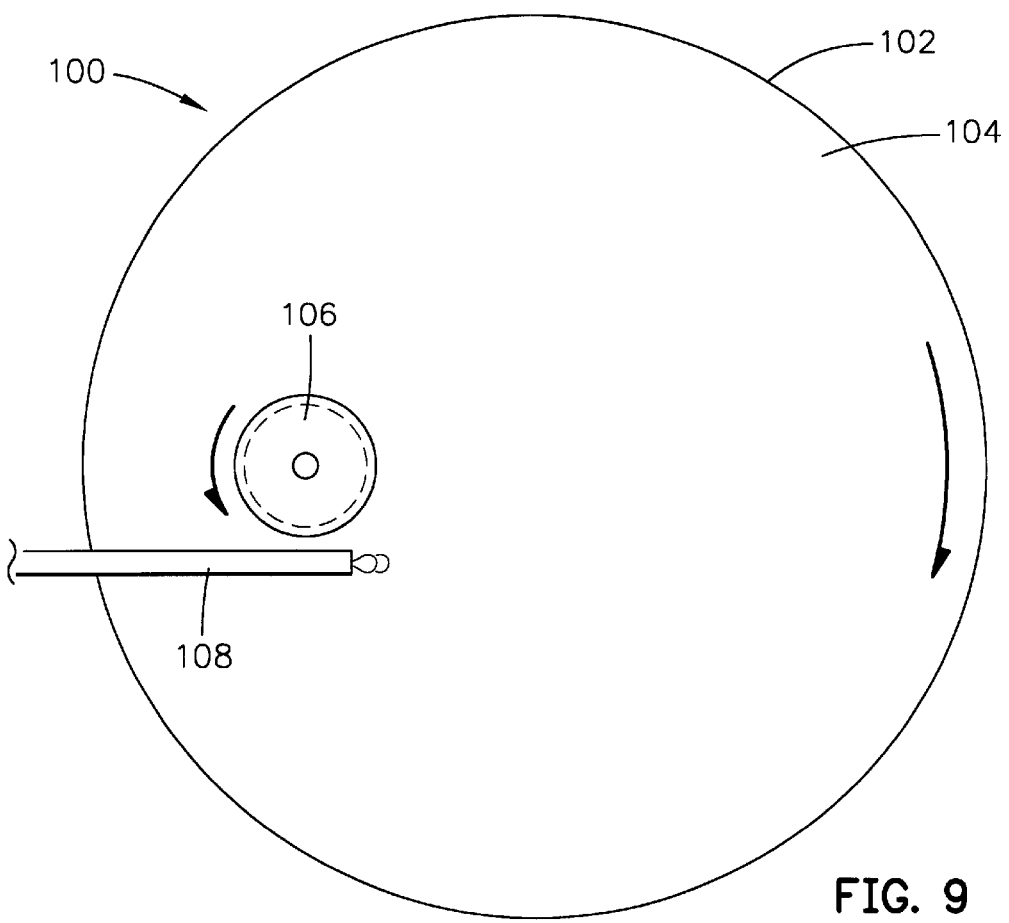
FIG. 9 is a view taken along plane 9—9 of FIG. 8.

FIG. 3 illustrates the wafer 28 with rows and columns of magnetic head assemblies 60 which can be planarized by chemical mechanical polishing (CMP) in a tool which is shown in FIGS. 8 and 9, and which will be described in more detail hereinafter. Steps for polishing one of the partially completed magnetic head assemblies 60 is shown in FIGS. 4, 5, 6A, 6B, 7A and 7B. In FIG. 4, after depositing the first shield layer 62, the first read gap layer 64, the read sensor 66 and the second read gap layer 68, a full film second shield first pole piece layer 70 is formed by frame plating. FIG. 5 is the same as FIG. 4 except etching has been employed for defining the shape of the second shield first pole piece layer 72 and the first and second read gap layers 64 and 68. FIG. 6A is the same as FIG. 5 except a layer of alumina 73 has been sputter deposited on the partially completed magnetic head assembly at a level higher than the top surface of the second shield first pole piece layer 72. It can be seen that the alumina takes a still higher profile above the second shield first pole piece layer 72 because of the profile of the latter.

Figure 6B:
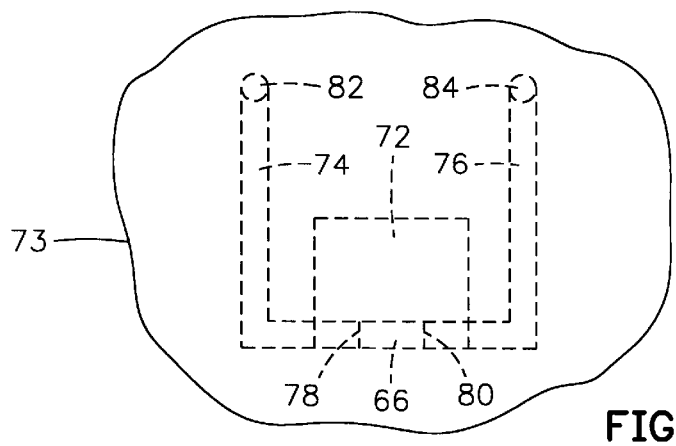
FIG. 6B is a view taken along plane 6B—6B of FIG. 6A.

FIG. 6B shows a plan view of FIG. 6A wherein first and second lead layers 74 and 76 are connected to first and second side edges 78 and 80 of the read sensor 66 and extend rearwardly into the head to first and second copper studs 82 and 84. The formation of these studs is accomplished by etching vias to the first and second lead layers 74 and 76 and plating copper material in the vias. This step is done before the deposition of the alumina layer in FIG. 6A. In FIG. 7A chemical mechanical polishing is implemented to polish the alumina 73, the second shield first pole piece layer 72 and the copper studs 82 and 84 at the same rate to a common plane 88. Accordingly, the alumina, the second shield first pole piece layer 72 and the copper studs 82 and 84 have top surfaces 90, 92, 94 and 96 respectively that lie in the common plane 88 as seen in FIG. 7B. As will be described hereinafter, the invention provides a slurry which, in a first aspect, chemically mechanically polishes the alumina 73 and the second shield first pole piece layer 72 at the same rate to a common plane and, in a second aspect, additionally chemically mechanically polishes the copper studs 94 and 96 at the same rate as the alumina and the second shield first pole piece layer to a common plane.

An exemplary chemical mechanical polishing (CMP) tool is illustrated at 100 in FIGS. 8 and 9. The CMP tool includes a turntable 102 upon which a pad 104 is mounted. The wafer substrate 28 of FIG. 3 is mounted on a rotatable holder 106 which brings the wafer substrate in contact with the pad 104. While the turntable 102 and the holder 106 counterrotate the slurry is dispensed on the pad 104 by a tubular dispenser 108. The rotations of the tool and the slurry causes the aforementioned chemical mechanical polishing of the partially completed magnetic head assemblies on the wafer substrate 28.

Figure 10:
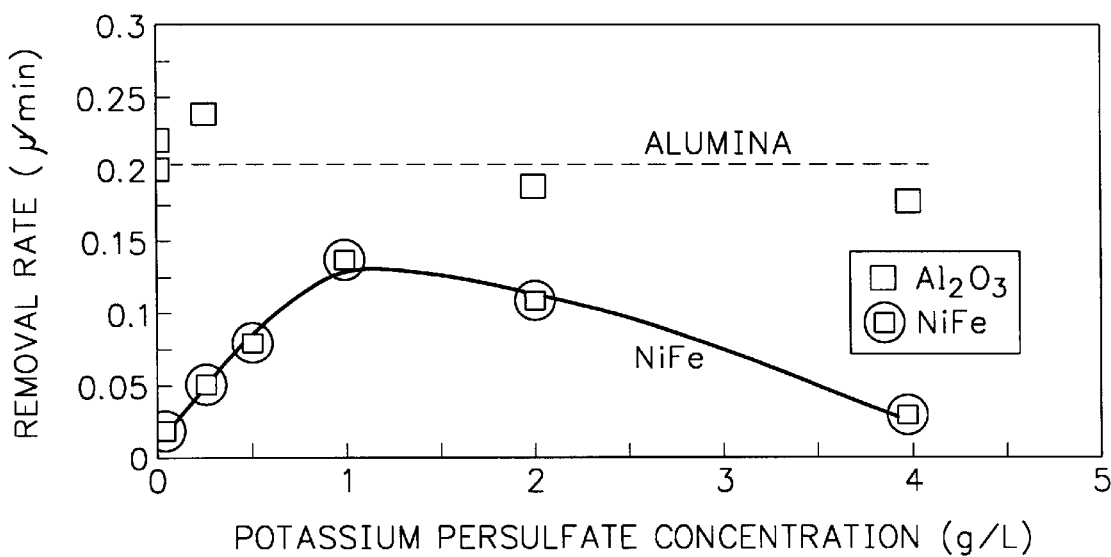
FIG. 10 is a graph illustrating the rate of removal of materials of a workpiece per persulfate concentration.
Figure 11:
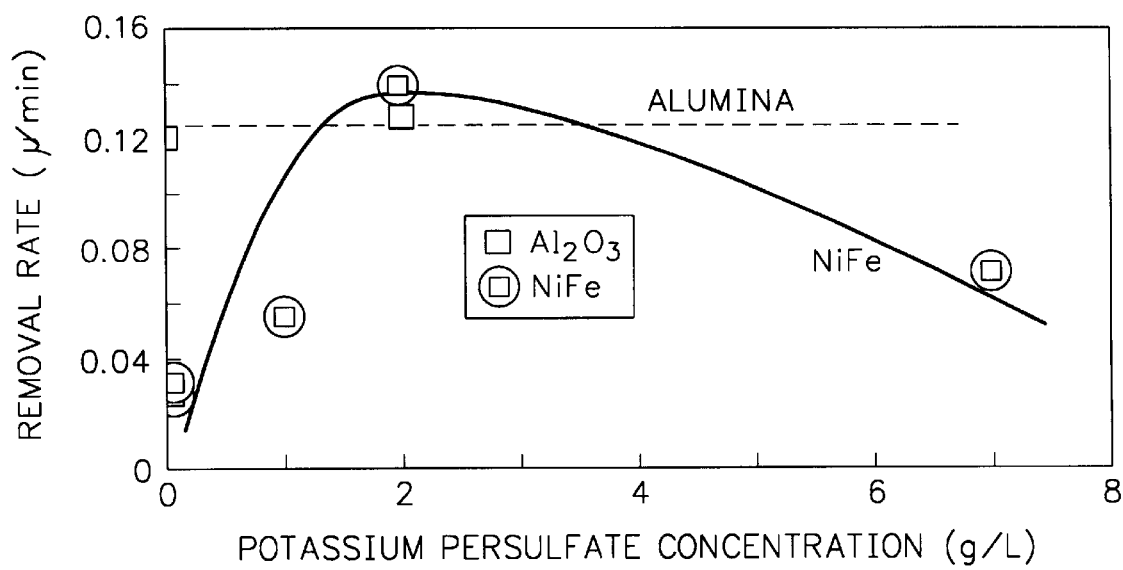
FIG. 11 is a graph, which is the same as FIG. 10, except a first concentration of silica has been reduced from 12% to 6% of the slurry.

The first aspect of the present invention is illustrated in FIGS. 10 and 11. FIG. 10 is a graph illustrating the rate of removal in microns per minute of alumina and nickel iron (NiFe) per potassium persulfate ($K_2S_2O_8$) concentration in grams per liter (g/L) for a 12% by weight silica abrasive in a water based slurry with a pH of 10.3. The silica had a size of about 50 nanometers (nm). It can be seen from this graph that as the concentration of the potassium persulfate ($K_2S_2O_8$) increased from 0 to 4 grams per liter the rate of removal of the alumina remained substantially constant while the rate of removal of the nickel iron increased to a maximum at the concentration of the potassium persulfate ($K_2S_2O_8$) of 1 g/L. However, with the concentrations shown in FIG. 10, the rate of removal of the nickel iron remained below the rate of removal of the alumina.

In FIG. 11 the colloidal silica was decreased from 12% to 6% by weight of the slurry. It can be seen from FIG. 11 that the rate of removal of the alumina has now been reduced from slightly greater than 0.2 to slightly greater than 0.12 microns per minute, so that the rate of removal of the alumina and the nickel iron can be equal. The rates are equalized at a potassium persulfate ($K_2S_2O_8$) concentration of approximately 1.2 and 3.8 grams per liter. Substantial equalization is demonstrated between a potassium persulfate ($K_2S_2O_8$) concentration in a range of 1 to 4 g/L in a slurry with a pH of 10.3. The exact concentration of the persulfate will depend on the pH of the slurry. The concentration of persulfate will be lower if the pH is lower. FIG. 11 illustrates a first aspect of the invention wherein a first concentration of the colloidal silica and a second concentration of the potassium persulfate ($K_2S_2O_8$) results in an equal rate of removal of the alumina and the nickel iron so that these two materials can be chemically mechanically polished to a common plane. It should be understood that sodium persulfate ($Na_2S_2O_8$) can be substituted equally for potassium persulfate ($K_2S_2O_8$). In addition to nickel iron several other metals, including magnesium, zinc, cadmium, aluminum, titanium, chromium, molybdenum, manganese, iron, cobalt, nickel, palladium, platinum, copper, silver, gold and alloys of these metals, can be polished in this slurry at rates which can be adjusted by variation in the concentration of persulfate and of complex species, and by variation of the pH and the abrasive concentration. The slurry is also effective if the abrasive is colloidal alumina rather than the colloidal silica exemplified above.

Figure 12:
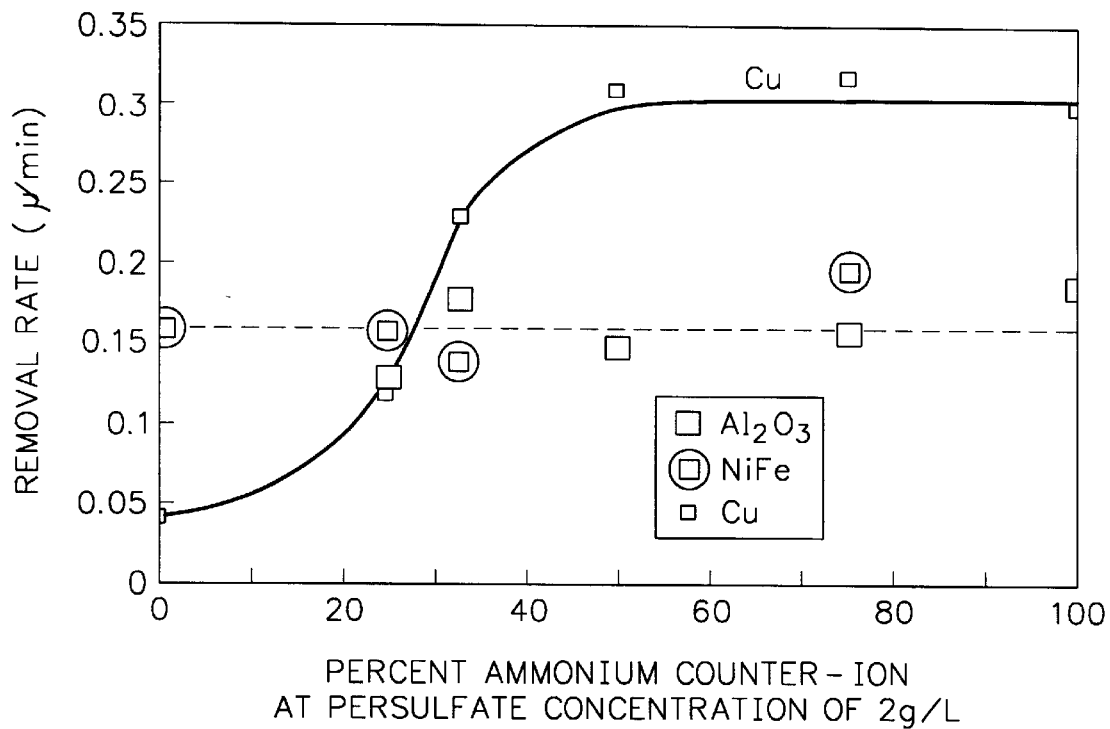
FIG. 12 is a graph illustrating the removal of alumina and first and second metals of a workpiece with various ratios of a third concentration of ammonia persulfate to potassium persulfate.

A second aspect of the present invention is illustrated in the graph shown in FIG. 12. FIG. 12 shows the results of our research wherein the first concentration of colloidal silica is 6% by weight of the slurry and the persulfate concentration is maintained at 2 g/L in a slurry with a pH of 10.3, as shown in FIG. 11, while the ratio of ammonium persulfate (($NH_4)_2S_2O_8$) to potassium persulfate ($K_2S_2O_8$) is varied for the purpose of, not only chemically mechanically polishing the alumina and the nickel iron at the same rate, but, also chemically mechanically polishing a second metal, namely copper at the same rate so that the alumina, the nickel iron and the copper can be chemically mechanically polished to a common plane. It can be seen from the graph in FIG. 12 that when a third concentration of the ammonium persulfate (($NH_4$)$_2$$S_2$$O_8$) to the potassium persulfate ($K_2$$S_2$$O_8$) is about 33% that the rate of removal of the alumina, the nickel iron and the copper are equal. Again, it should be understood that sodium persulfate ($Na_2$$S_2$$O_8$) may be substituted for the potassium persulfate ($K_2$$S_2$$O_8$) to obtain substantially the same results. Further, in lieu of the nickel iron and the copper, first and second groups of metals may be substituted for chemical mechanical polishing within the spirit of the invention. It should be noted from FIG. 12 as the percent ammonium counter-ion of ammonium to potassium changes from 0 to 100 the rate of removal of alumina stays substantially constant at 0.17. It should also be noted from FIG. 12 that significantly improved results are obtained when the percent ammonium counter-ion is at a range between 20% to 40%.

Figure 13:
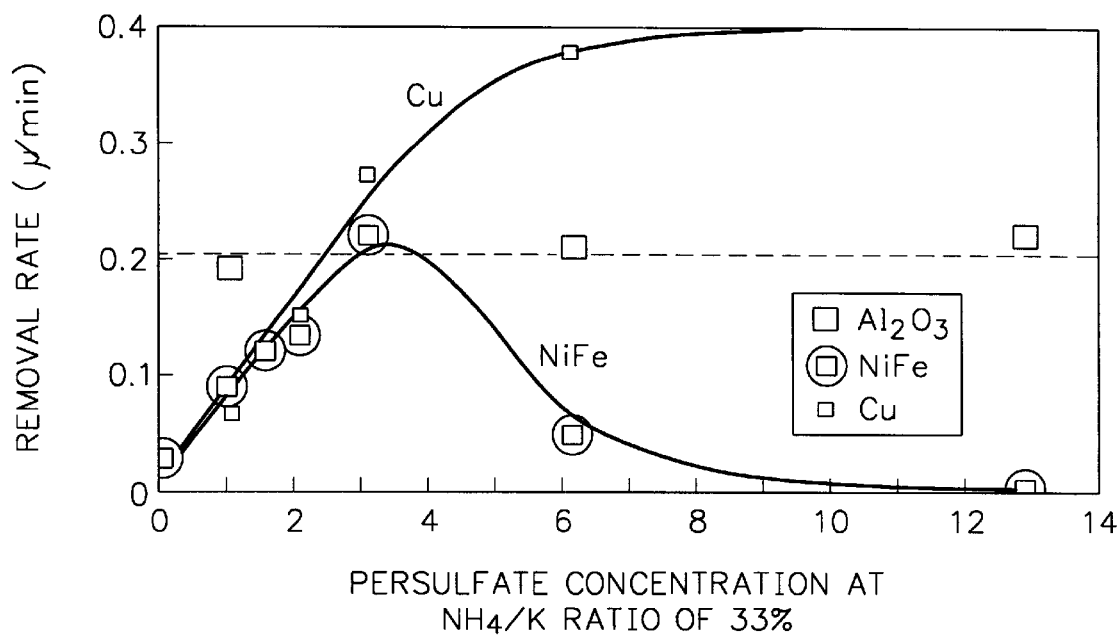
FIG. 13 is a graph illustrating the removal of alumina and first and second metals of a workpiece per an ammonium persulfate to a potassium persulfate ratio of 33%.

A third aspect of the invention is illustrated in FIG. 13 wherein the weight percentage of silica has been increased from 6% to 9% in the slurry with a pH of 10.3 while a persulfate concentration of ammonium to potassium ratio is maintained at 33% which is shown to be the most desirable in FIG. 12. By increasing the weight percentage of the silica, the rate of removal of the alumina has been increased from 0.17 to 0.21 microns per minute which is a faster removal rate than that shown in FIG. 12. At a persulfate concentration of 3 g/L the removal rates of alumina, nickel iron and copper are equalized so that they can be chemically mechanically polished to a common plane at a quicker rate than that demonstrated in FIG. 12. Again, sodium persulfate ($Na_2$$S_2$$O_8$) may be substituted for the potassium persulfate ($K_2$$S_2$$O_8$) and groups of metals can be employed in lieu of the nickel iron. Further, in lieu of employing sodium persulfate ($Na_2$$S_2$$O_8$) or potassium persulfate ($K_2$$S_2$$O_8$) singly a combination of sodium persulfate ($Na_2$$S_2$$O_8$) and potassium persulfate ($K_2$$S_2$$O_8$) may be employed in a desired ratio to practice the invention.

The invention also includes the method of making the slurry for the first, second and third aspects of the invention as well as a method of planarizing a partially completed magnetic head which has alumina and a first metal of nickel iron and, optionally, a second metal of copper.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawings.

We claim:

1. A slurry for chemical mechanical polishing of a surface comprised of a plurality of materials, the slurry comprising:
    a liquid;
    a colloidal abrasive;
    at least one persulfate selected from the group consisting of potassium persulfate and sodium persulfate;
    the colloidal abrasive having a first percent concentration by weight relative to the liquid and the at least one persulfate, and the at least one persulfate having a second concentration in grams per liter relative to the liquid and the colloidal abrasive; and
    the first percent concentration by weight of the colloidal abrasive, the second concentration in grams per liter of the at least one persulfate, and a pH are selected so that different materials in a surface can be simultaneously chemically mechanically polished at substantially the same rate.

2. The slurry as claimed in claim 1, wherein the liquid is water.

3. The slurry as claimed in claim 2, wherein the colloidal abrasive is colloidal silica.

4. The slurry as claimed in claim 3, wherein the different materials in the surface comprises alumina and a first metal, wherein the first metal is selected from the group consisting of nickel iron, magnesium, zinc, cadmium, aluminum, titanium, chromium, molybdenum, manganese, iron, cobalt, nickel, palladium, platinum, copper, silver, gold and alloys thereof, and wherein concentrations of ingredients are chosen such that the alumina and the first metal can be chemically mechanically polished at substantially the same rate.

5. The slurry as claimed in claim 4, wherein the first percent concentration by weight of the colloidal abrasive is in a range from 6% to 9% by weight relative to the liquid and the at least one persulfate.

6. The slurry as claimed in claim 5, wherein the second concentration in grams per liter of the at least one persulfate is between 1 and 4 grams per liter relative to the liquid and the colloidal abrasive.

7. The slurry as claimed in claim 1, wherein the first percent concentration by weight of the colloidal abrasive is about 6% by weight relative to the liquid and the at least one persulfate, and the second concentration in grams per liter of the at least one persulfate is in a range from 1.25 to 3.75 grams per liter relative to the liquid and the colloidal abrasive.

8. The slurry as claimed in claim 7, wherein the second concentration in grams per liter of the at least one persulfate is about 2 grams per liter relative to the liquid and the colloidal abrasive with the pH being about 10.3.

9. The slurry as claimed in claim 1 further comprising:
    ammonium persulfate;
    the ammonium persulfate having a third concentration in grams per liter relative to the liquid, the colloidal abrasive and the at least one persulfate;
    the first percent concentration by weight of the colloidal abrasive, the second concentration in grams per liter of the at least one persulfate and the third concentration in grams per liter of the ammonium persulfate being selected so that alumina and a first and a second metal can be simultaneously chemically mechanically polished at substantially the same rate.

10. The slurry as claimed in claim 9, wherein the liquid is water.

11. The slurry as claimed in claim 10, wherein the colloidal abrasive is colloidal silica.

12. The slurry as claimed in claim 11, wherein the first percent concentration by weight of the colloidal abrasive is in a range from 6% to 9% by weight relative to the liquid, the ammonium persulfate and the at least one persulfate.

13. The slurry as claimed in claim 9, wherein a total of the second concentration in grams per liter of the at least one persulfate and the third concentration in grams per liter of the ammonium persulfate is in a range from 2 to 4 grams per liter relative to a liquid and the colloidal abrasive.

14. The slurry as claimed in claim 11, wherein the first percent concentration by weight of the colloidal abrasive is about 6% by weight relative to the liquid, the ammonium persulfate and the at least one persulfate;
    a total of the second concentration in grams per liter of the at least one persulfate and the third concentration in grams per liter of the ammonium persulfate is about 2 grams per liter relative to the liquid and the colloidal abrasive; and
    a ratio of the third concentration in grams per liter of the ammonium persulfate to the second concentration in grams per liter of the at least one persulfate is about 20% to 35%.

15. The slurry as claimed in claim 14, wherein the third concentration in grams per liter of the ammonium persulfate to the second concentration in grams per liter of the at least one persulfate is about 33%.

16. The slurry as claimed in claim 13, wherein the first percent concentration by weight of the colloidal abrasive is about 9% by weight relative to the liquid, the ammonium persulfate and the at least one persulfate and a ratio of the third concentration in grams per liter of the ammonium persulfate to the second concentration in grams per liter of the at least one persulfate is about 33%.

17. The slurry as claimed in claim 16, wherein a total of the second concentration in grams per liter of the at least one persulfate and the third concentration in grams per liter of the ammonium persulfate is about 3 grams per liter relative to a liquid and colloidal abrasive.

18. A method of making a slurry for chemically mechanically polishing of a surface including alumina and nickel iron, comprising:

proviing water;

adding to the water, without order, a first percent concentration by weight of colloidal silica and a second concentration in grams per liter of at least one persulfate selected from the group consisting of potassium persulfate and sodium persulfate; wherein the first percent concentration by weight of the colloidal silica, the second concentration in grams per liter of the at least one persulfate, and a pH are selected, such that a surface including alumina and nickel iron can be planarized by chemical mechanical polishing at substantially the same rate.

19. The method of making a slurry as claimed in claim 18, wherein the first percent concentration by weight of the colloidal silica is in a range from 6% to 9% by weight relative to the water and the at least one persulfate.

20. The method of making a slurry as claimed in claim 19, wherein the second concentration in grams per liter of the at least one persulfate is in a range from 1 to 4 grams per liter relative to the water and the colloidal silica.

21. The method of making a slurry as claimed in claim 18, wherein the first percent concentration by weight of the colloidal silica is about 6% by weight relative to the water and the at least one persulfate; and the second concentration in grams per liter of the at least one persulfate is about 2 grams per liter relative to the water and the colloidal silica.

22. The method of making a slurry as claimed in claim 21, wherein the second concentration in grams per liter of the at least one persulfate is about 2 grams per liter relative to the water and the colloidal silica with a pH being about 10.3.

23. The method for making a slurry as claimed in claim 18, which is effective for planarizing a surface including alumina, nickel iron and copper using chemical mechanical polishing, comprising:

while maintaining the first percent concentration by weight of the colloidal silica, providing a third concentration in grams per liter of ammonium persulfate in the water in a ratio of third concentration in grams per liter of ammonium persulfate to an adjusted second concentration in grams per liter of at least one persulfate and planarizing the alumina, nickel iron and copper using chemical mechanical polishing.

24. The method for making a slurry as claimed in claim 23, including, while maintaining said ratio of the third concentration in grams per liter of the ammonium persulfate to the adjusted second concentration in grams per liter of the at least one persulfate constant, providing an adjusted first percent concentration by weight of the colloidal silica that optimizes a rate of chemically mechanically polishing the alumina, nickel iron and the copper for producing a planar surface.

25. The method for making a slurry as claimed in claim 23, wherein the first percent concentration by weight is in a range from 6% to 9% by weight relative to the water and the at least one persulfate.

26. The method for making a slurry as claimed in claim 25, wherein a total of the second concentration in grams per liter of the at least one persulfate and the third concentration in grams per liter of ammonium persulfate is about 2 to 4 grams per liter relative to the water and the first percent concentration by weight of the colloidal silica.

27. The method for making a slurry as claimed in claim 23, wherein the first percent concentration by weight is about 6% by weight relative to the water, the at least one persulfate and the ammonium persulfate;

a total of the second concentration in grams per liter of the at least one persulfate and the third concentration in grams per liter of the ammonium persulfate is about 2 grams per liter relative to the water and the colloidal silica; and a ratio of the third concentration in grams per liter of the ammonium persulfate to the second concentration on grams per liter of the at least one persulfate is in a range from 20% to 35%.

28. The method for making a slurry as claimed in claim 27, wherein the ratio of the third concentration in grams per liter of the ammonium persulfate to the second concentration in grams per liter of the at least one persulfate is about 33%.

29. The method for making a slurry as claimed in claim 26, wherein the first percent concentration by weight is about 9% by weight relative to the water, the at least one persulfate and the ammonium persulfate; and a ratio of the third concentration in grams per liter of the ammonium persulfate to the second concentration in grams per liter of the at least one persulfate is about 33%.

30. The method for making a slurry as claimed in claim 29, wherein a total of the second concentration in grams per liter of the at least one persulfate and the third concentration in grams per liter of the ammonium persulfate is about 3 grams per liter relative to the water and colloidal silica.

* * * * *